United States Patent [19]
Fukazawa et al.

[11] Patent Number: 5,515,232
[45] Date of Patent: May 7, 1996

[54] STATIC PROTECTION CIRCUIT FOR A SEMICONDUCTOR INTEGRATED CIRCUIT DEVICE

[75] Inventors: Hidetaka Fukazawa, Chofu; Satoshi Sekine, Kawasaki, both of Japan

[73] Assignee: Motorola, Inc., Schaumburg, Ill.

[21] Appl. No.: 310,515

[22] Filed: Sep. 22, 1994

[30] Foreign Application Priority Data

Oct. 4, 1993 [JP] Japan ................... 5-248063

[51] Int. Cl.$^6$ ............................................. H02H 9/04
[52] U.S. Cl. ................. 361/111; 361/56; 361/91
[58] Field of Search ................. 361/56, 111, 91, 361/58

[56] References Cited

U.S. PATENT DOCUMENTS 4,736,271  4/1988  Mack et al. ................. 361/91
5,034,845  7/1991  Murakami ................. 361/56

*Primary Examiner*—Todd DeBoer
*Attorney, Agent, or Firm*—Gary W. Hoshizaki; Masanori Honjo

[57] ABSTRACT

A static protection circuit for a semiconductor integrated circuit device which provides static protection for an integrated circuit driven on multiple different power supply voltages is provided.

The static protection circuit comprises a transistor having its two controlled terminals connected to each of the power supply lines and a GND line, respectively, and its control line connected to one of said controlled terminals; and a transistor having its controlled terminals connected to each of said power supply lines and its control terminal to which a nonconductive voltage is applied.

4 Claims, 3 Drawing Sheets

STATIC PROTECTION CIRCUIT FOR A SEMICONDUCTOR INTEGRATED CIRCUIT DEVICE

FIELD OF THE INVENTION

The present invention relates to a static protection circuit for a semiconductor integrated circuit device.

BACKGROUND OF THE INVENTION

With an integrated circuit (IC) package as a semiconductor IC device, static electricity charged on a human body, for example, may be discharged through lead pins of the IC package, thus leading to physical failure or breakdown of the IC. To prevent such failure or breakdown due to static electricity, a semiconductor IC device having a static protection circuit provided on a silicon chip within the IC package is known.

FIG. 1 shows such a static protection circuit 2 formed on a silicon chip. The static protection circuit 2 is formed between a Vdd bus line 3 for providing power supply to circuit elements (not shown) disposed on the silicon chip and a GND (ground) bus line 4. The Vdd bus line 3 is arranged to receive an external power supply from a Vdd lead pin of the IC package via wire W and pad Pd. The static protection circuit 2 is formed near the pad Pd.

Such a static protection circuit 2 is comprised of an N-channel FET (field effect transistor) 21. A drain terminal D and a source terminal S of the N-channel FET 21 are connected to the Vdd bus line 3 and GND bus line 4, respectively, while its gate terminal is connected to the source terminal S.

With such an arrangement, when an overvoltage is applied across the Vdd bus line 3 and GND bus line 4 via the lead pin of the IC package due to electrostatic discharge, the resulting overvoltage is applied across the drain terminal D and source terminal S of the N-channel FET 21, resulting in a breakdown of the N-channel FET 21. This immediately renders the N-channel FET 21 conductive, thus shorting the Vdd bus line 3 and GND bus line 4. Therefore, the overvoltage-induced current is absorbed through a path from the Vdd bus line 3 to the N-channel FET 21 to the GND bus line 4, thereby preventing the overvoltage-induced current from flowing into the circuit elements.

The operation of a static protection circuit adapted to an integrated circuit driven by a single power supply (Vdd) has been described above; now, the operation of a static protection circuit adapted to an integrated circuit driven by multiple power supplies with different voltages will be described below.

FIG. 2 shows a configuration of a static protection circuit adapted to an integrated circuit driven at two different types of power supply voltages, Vdd1 and Vdd2. A Vdd1 bus line 7 receives a power supply of a first power supply voltage Vdd1 from a Vdd1 lead pin of the IC package via wire W and pad Pd. On the other hand, a Vdd2 bus line 8 receives a power supply of a second power supply voltage Vdd2 from a Vdd2 lead pin of the IC package via wire W and pad Pd. A static protection circuit 2a is comprised of N-channel FETs 21 and 22. A drain terminal D and a source terminal S of the N-channel FET 21 are connected to a Vdd1 bus line 7 and a GND bus line 4, respectively, while its gate is connected to the source terminal S. On the other hand, a drain terminal D and a source terminal S of the N-channel FET 22 are connected to a Vdd2 bus line 8 and the GND line 4, respectively, while its gate terminal is connected to the source terminal S.

With such a configuration, when an overvoltage is applied between the Vdd1 bus line 7 and GND bus line 4 due to electrostatic discharge, the N-channel FET 21 of the static protection circuit 2a breaks down. This immediately renders the N-channel FET 21 conductive, thus shorting the Vdd1 bus line 7 and GND bus line 4. Therefore, because the overvoltage-induced current is absorbed by a path from the Vdd1 bus line 7 to the N-channel FET 21 to the GND bus line 4, the resulting overvoltage-induced current is prevented form flowing into the circuit elements. On the other hand, when an overvoltage is applied between the Vdd2 bus line 8 and GND bus line 4 due to electrostatic discharge, the N-channel FET 22 of the static protection circuit 2a breaks down. This immediately renders the N-channel FET 22 conductive, thus shorting the Vdd2 bus line 8 and GND bus line 4. Therefore, because the resulting overvoltage-induced current is absorbed by a path from the Vdd2 bus line 8 to the N-channel FET 22 to the GND bus line 4, this overvoltage-induced current is prevented from flowing into the circuit elements.

Additionally, when an overvoltage is applied between the Vdd1 bus line 7 and Vdd2 bus line 8 due to electrostatic discharge, one of the N-channel FETs 21 and 22 which has a higher potential breaks down, causing the FET with a lower potential to be forward for a parasitic diode. This immediately renders both the N-channel FETs 21 and 22 conductive, thus shorting the Vdd1 bus line 7 and GND bus line 4, and the Vdd2 bus line 8 and GND bus line 4, respectively. As a result, the afore-described overvoltage-induced current flows along a path comprised of the Vdd1 bus line 7, N-channel FET 21, GND bus line 4, N-channel FET 22 and Vdd2 bus line 8.

However, since the current due to overvoltage of electrostatic discharge first flows into a section (P) of the GND bus line 4, there is a problem that the resulting overvoltage-induced current flows into circuit elements (not shown) connected onto this section (P) of the GND bus line 4, thus damaging the elements.

The present invention is intended to solve such problems, and it is an object of the present invention to provide a static protection circuit for a semiconductor integrated circuit device, which permits static protection for an IC circuit driven on a plurality of power supplies having different voltages.

A static protection circuit for a semiconductor integrated circuit according to the present invention includes a plurality of power supply lines for supplying different power supply voltages and a GND line, said static protection circuit comprising first and second transistors each having two controlled terminals connected to each of said power supply lines and said GND line, respectively, and a control terminal connected to one of said controlled terminals; and a third transistor having controlled terminals connected to each of said power supply lines, and a control terminal to which a nonconductive voltage is applied.

SUMMARY OF THE INVENTION

The transistor having its two controlled terminals connected to each of the power supply lines and the GND line, respectively, and its control terminal connected to one of said controlled terminals becomes conductive between said controlled terminals when a high voltage is applied between each of said power supply lines and the GND line, whereas the transistor having its controlled terminals connected to each of said power supply lines and its control terminal to which a nonconductive voltage is applied becomes conductive between said controlled terminals when a high voltage is applied between each of said power supply lines.

DETAILED DESCRIPTION OF THE INVENTION

Figure 1:
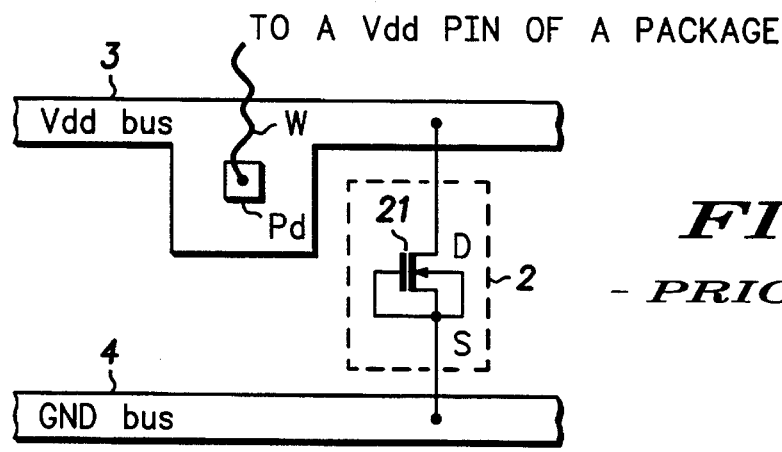
FIG. 1 is a schematic diagram illustrating a prior art static protection circuit.
Figure 2:
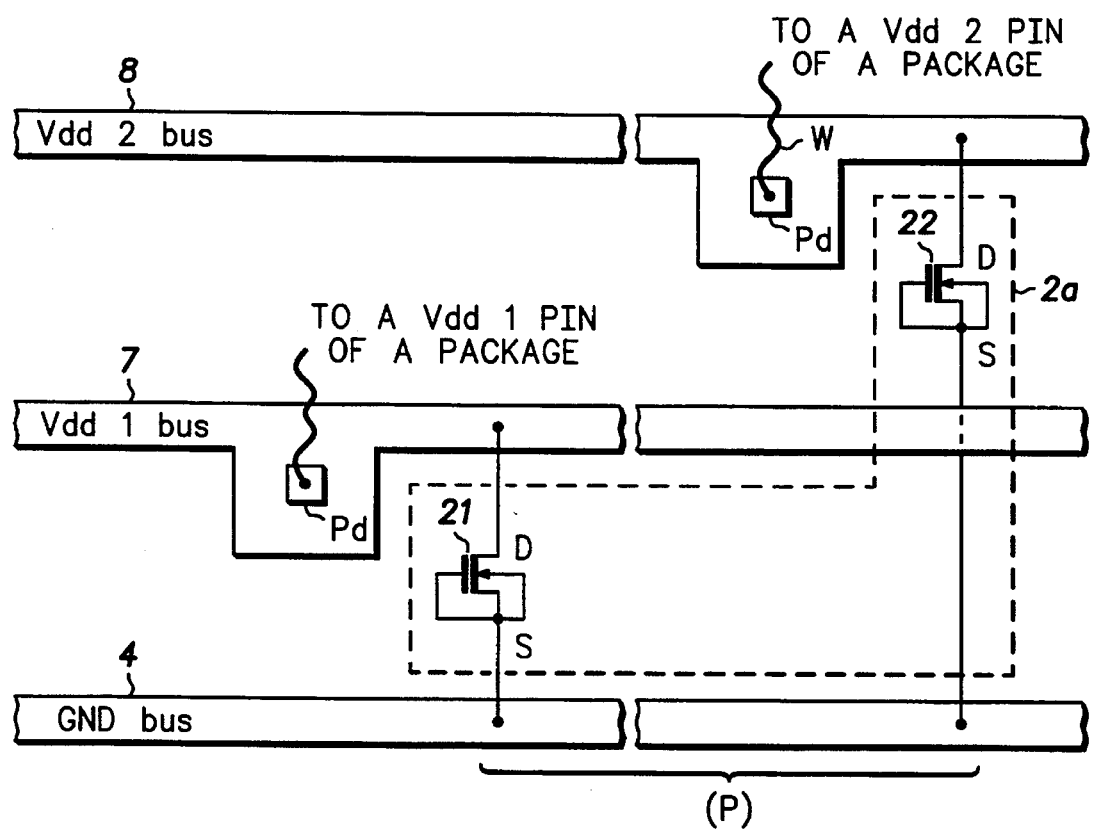
FIG. 2 is a schematic diagram illustrating another prior art static protection circuit.
Figure 3:
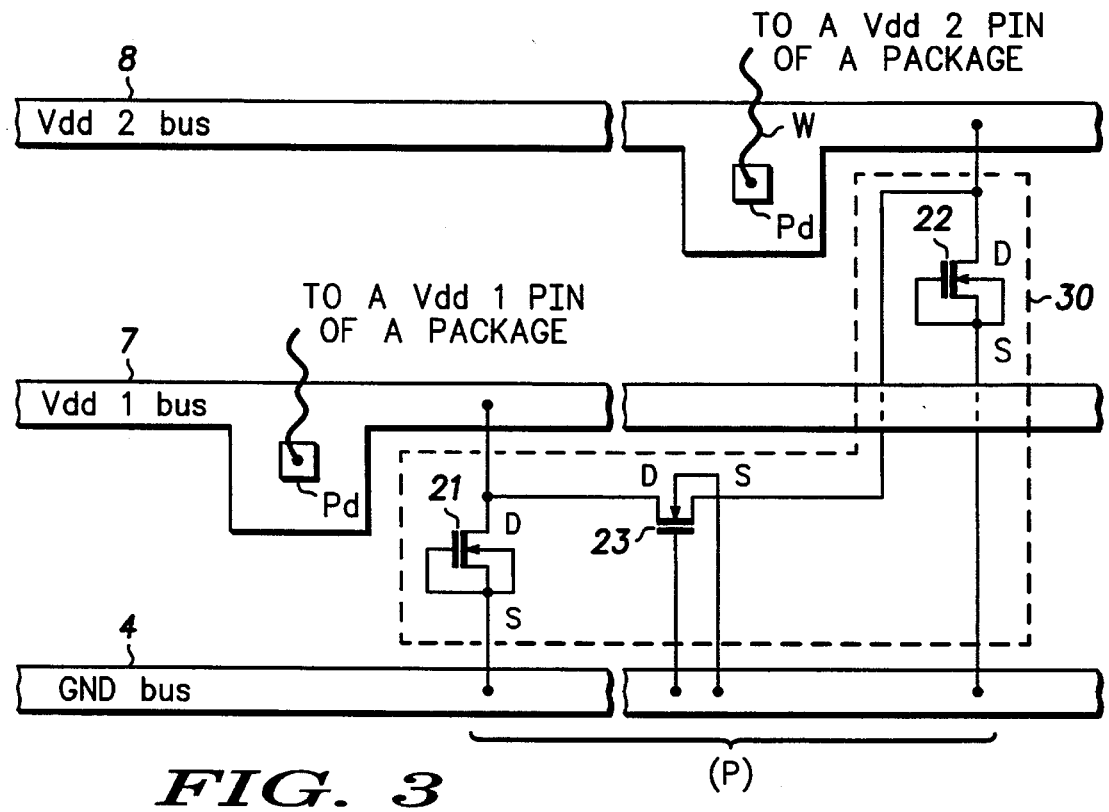
FIG. 3 is a schematic diagram illustrating one example of a static protection circuit according to the present invention.

FIG. 3 shows one example of a static protection circuit for a semiconductor integrated circuit device according to the present invention. A Vdd1 bus line 7 receives a power supply of a first power supply voltage Vdd1 from a Vdd1 lead pin of the IC package via wire W and pad Pd. On the other hand, a Vdd2 bus line 8 receives a power supply of a second power supply voltage Vdd2 from a Vdd2 lead pin of the IC package via wire W and pad Pd. As shown, the static protection circuit 30 according to the present invention is comprised of a N-channel FET 23, in addition to N-channel FETs 21 and 22. A drain terminal D and a source terminal S of the N-channel FET 21 are connected to the Vdd1 bus line 7 and the GND bus line 4, respectively, while its gate terminal is connected to the source terminal S. On the other hand, a drain terminal D and a source terminal S of the N-channel FET 22 are connected to the Vdd2 bus line 8 and GND bus line 4, respectively, while its gate terminal is connected to the source terminal S. A drain terminal D (or source terminal S) of the N-channel FET 23 is connected to the drain terminal D of the N-channel FET 21, while the source terminal S (or drain terminal D) of the N-channel FET 23 is connected to the drain terminal D of the N-channel FET 22. To a gate terminal and back-gate of the N-channel FET 23 is connected the GND bus line 4.

Next, the operation of such an arrangement is described below.

First, its normal operation, that is, a situation where the IC package is connected to an external unit and this IC package receives power supplies (Vdd1 and Vdd2), is described. Then, because a GND potential is applied via the source terminal S to the gate terminals of the N-channel FETs 21 and 22, both the N-channel FETs 21 and 22 are off. Additionally, because a GND potential is also applied directly to the gate terminal of the N-channel FET 23, the N-channel FET 23 is also off. Thus, the Vdd1 bus line 7, Vdd2 bus line 8 and GND bus line 4 are isolated from each other.

Next, a situation where the IC package is in a floating state (a state where the lead pins of the IC package are not connected to anything) will be described.

When an overvoltage is applied between the Vdd1 bus line 7 and GND bus line 4 under an influence of electrostatic discharge, such an influence causes the N-channel FET 21 to break down. This immediately renders the N-channel FET 21 conductive, thus shorting the Vdd1 bus line 7 and GND bus line 4. Therefore, because the overvoltage-induced current is absorbed by a path from the Vdd1 bus line to the N-channel FET 21 to the GND bus line 4, the overvoltage-induced current can be prevented from flowing into the circuit elements.

Now, assuming that an overvoltage is applied between the Vdd2 bus line 8 and GND bus line 4 under an influence of electrostatic discharge, such an influence causes the N-channel FET 22 to break down. This immediately renders the N-channel FET 22 conductive, thus shorting the Vdd2 bus line 8 and GND bus line 4. Therefore, because the overvoltage-induced current is absorbed by a path from the Vdd2 bus line 8 to the N-channel FET 22 to GND bus line 4, the overvoltage-induced current can be prevented from flowing into the circuit elements.

Next, assume that an overvoltage is applied between the Vdd1 bus line 7 and Vdd2 bus line 8 under an influence of electrostatic discharge. Then, such an influence causes the N-channel FET 23 to break down. This immediately renders the N-channel FET 23 conductive, thus shorting the Vdd1 bus line 7 and Vdd2 bus line 8. Therefore, because the overvoltage-induced current is absorbed by a path from the Vdd1 bus line 7 to the N-channel FET 23 to the Vdd2 bus line 8, the overvoltage-induced current can be prevented from flowing into the circuit elements.

As such, the static protection circuit 30 is arranged so that between the Vdd1 bus line 7 and Vdd2 bus line 8 is connected the N-channel FET 23 having its gate terminal to which a GND voltage is applied as a nonconductive voltage that renders its switching state nonconductive during a power supply. Thus, even if an overvoltage is applied between the Vdd1 bus line 7 and Vdd2 bus line 8 under an influence of electrostatic discharge, the resulting overvoltage-induced current is absorbed by a path formed of the Vdd1 bus line 7, N-channel FET 23 and Vdd2 bus line 8, so it can be prevented from flowing into a section (P) of the GND bus line 4. Consequently, the circuit elements connected onto this section (P) of the GND line 4 can be protected from any overvoltage due to electrostatic discharge.

Although in the above embodiment, the structure of the static protection circuit adapted to an integrated circuit driven on two different types of power supply voltages, Vdd1 and Vdd2, has been described, it should be appreciated that the present invention is not limited to such integrated circuits, but also applicable to any integrated circuit driven on multiple different power supply voltages.

Figure 4:
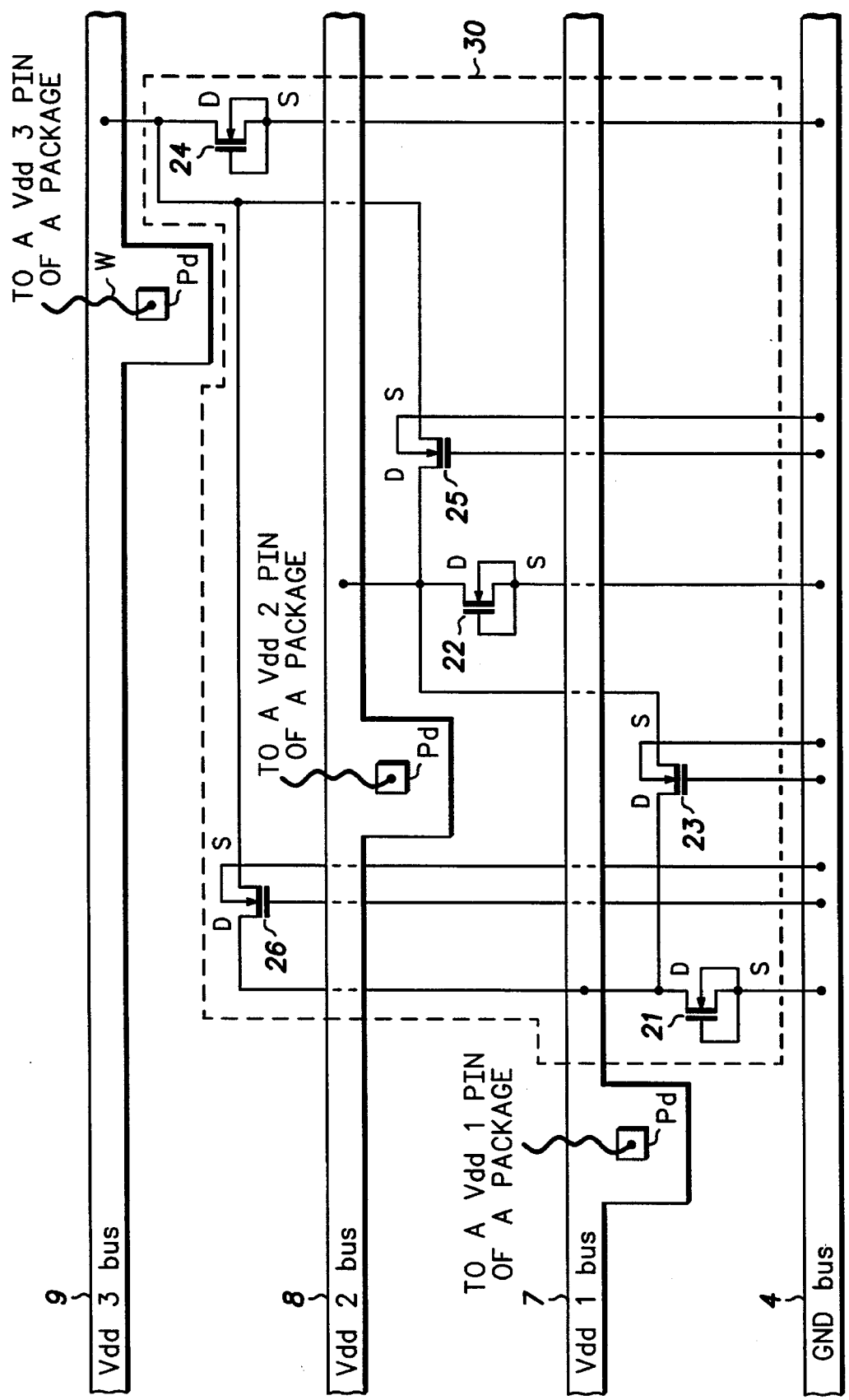
FIG. 4 is a schematic diagram illustrating another example of a static protection circuit according to the present invention.

FIG. 4 shows one example of a static protection circuit 30 according to the present invention, adapted to an integrated circuit driven on three different types of power supply voltages, Vdd1, Vdd2 and Vdd3. N-channel FETs 21, 22, and 24 having their gate and source terminals connected together are connected between each of the power supply bus lines and GND bus line, respectively, whereas N-channel FETs 23, 25 and 26 having their gate terminals connected to the GND bus line are also connected between each of the power supply bus lines, respectively.

Although in the above embodiment, there has been described the electrostatic protection circuit 30 in the form of N-channel FETs, it should be appreciated that this is not limiting, but the present invention may be implemented using P-channel FETs, or even bipolar transistors, depending on the transistors used in the circuit elements of the IC device.

Figure 5:
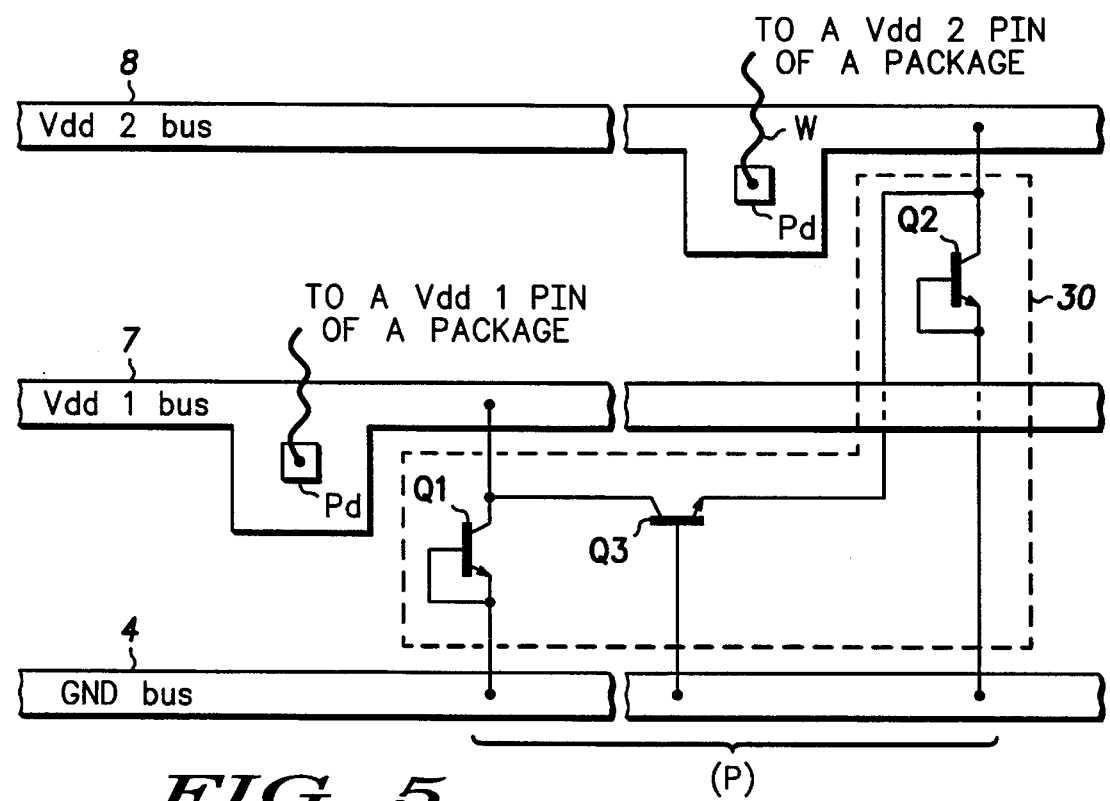
FIG. 5 is a schematic diagram illustrating still another example of a static protection circuit according to the present invention.

FIG. 5 shows an example of a static protection circuit where the N-channel FETs 21, 22 and 23 of the static protection circuit shown in FIG. 3 are replaced by bipolar transistors Q1, Q2, and Q3, respectively.

Transistors having gate terminals (base terminals) as their control terminals and source terminals (emitter terminals) as their controlled terminals connected together may be provided between each power supply line and the GND line; the source terminals (emitter terminals) and drain terminals (collector terminals) as controlled terminals of such transistors may be connected to each power supply line and the GND line, and a transistor having a gate terminal (base terminal) as its control terminal to which a nonconductive voltage for rendering its switching state nonconductive is applied may be provided between each of the power supply lines, with the source terminal (emitter terminal) and drain terminal (collector terminal) as its controlled terminals being connected between each of the power supply lines.

As described, implementing the static protection circuit 30 with the same type of transistor used in the circuit elements of the IC package will eliminate the need for changing the manufacturing process for such IC devices.

As is clear from the above description, a static protection circuit for a semiconductor integrated circuit device according to the present invention comprises a transistor having its two controlled terminals connected to each of power supply lines and a GND line, respectively, and its control terminal connected to one of said controlled terminals, and a transistor having its controlled terminals connected to each of said power supply lines, and its control terminal to which a nonconductive voltage is applied.

Accordingly, when an overvoltage is applied between each of said power supply lines and the GND line, a transistor having its two controlled terminals connected to each of the power supply lines and the GND line, respectively, and its control terminal connected to one of said controlled terminals breaks down, thus causing a short between each of said power supply lines and the GND line, so that the resulting overvoltage-induced current is absorbed, whereas when an overvoltage is applied between each of the said power supply lines, a transistor having its controlled terminals connected to each of said power supply lines and its control terminal to which a nonconductive voltage is applied breaks down, thus causing a short between said power supply lines, whereby the resulting overvoltage-induced current is absorbed.

Thus, according to the present invention, even with a semiconductor integrated circuit driven on multiple different power supply voltages, protection can be advantageously provided against failure or breakdown due to electrostatic discharge induced between each power supply pin and a GND pin, and also between power supply pins.

What is claimed is:

1. A static protection circuit for a semiconductor integrated circuit device, including at least first and second power supply lines that supply different power supply voltages and a GND line, said circuit comprising:

a first transistor having two controlled terminals and a control terminal, the controlled terminals connected to the first power supply line and said GND line, respectively, and the control terminal connected to one of said controlled terminals; and a second transistor having two controlled terminals and a control terminal, the controlled terminals connected to the second power supply line and said GND line, respectively, and the control terminal connected to one of said controlled terminals; and a third transistor having controlled terminals connected to each of said first and second power supply lines, and a control terminal to which a nonconductive voltage is applied.

2. A static protection circuit for a semiconductor integrated circuit device according to claim 1, wherein each of said first, second, and third transistors comprises the same type of transistor as used in circuit elements of said semiconductor integrated circuit device.

3. A static protection circuit for a semiconductor integrated circuit device according to claim 1, wherein each of said first, second, and third transistors comprises an N-channel FET, gate and source terminals of said first and second transistors are connected to each other, said source terminal and a drain terminal of said first and second transistors are connected to each of said power supply lines and said GND line, respectively, source and drain terminals of said third transistor are connected to said power supply lines, while a gate terminal of said third transistor is connected to said GND line.

4. A static protection circuit for a semiconductor integrated circuit device according to claim 1, wherein each of said first, second, and third transistors comprises a bipolar transistor; base and emitter terminals of said first and second transistors are connected to each other, said emitter terminal and a collector terminal of said first and second transistors are connected to each of said power supply lines and said GND line, respectively, emitter and collector terminals of said third transistor are connected to said power supply lines, while a base terminal of said third transistor is connected to said GND line.

* * * * *